(12) United States Patent
Hong et al.

(10) Patent No.: US 11,460,156 B2
(45) Date of Patent: Oct. 4, 2022

(54) FLEXIBLE LED FILM MODULE

(71) Applicant: LG ELECTRONICS INC., Seoul (KR)

(72) Inventors: Daewoon Hong, Seoul (KR); Sangtae Park, Seoul (KR); Myeongwook Bae, Seoul (KR); Jeongsik Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/273,269

(22) PCT Filed: Nov. 15, 2018

(86) PCT No.: PCT/KR2018/014020
§ 371 (c)(1),
(2) Date: Mar. 3, 2021

(87) PCT Pub. No.: WO2020/085566
PCT Pub. Date: Apr. 30, 2020

(65) Prior Publication Data
US 2021/0341112 A1 Nov. 4, 2021

(30) Foreign Application Priority Data

Oct. 26, 2018 (KR) ........................ 10-2018-0128776

(51) Int. Cl.
*F21S 4/22* (2016.01)
*F21V 29/70* (2015.01)
(Continued)

(52) U.S. Cl.
CPC .................................. *F21S 4/22* (2016.01);
*F21K 9/20* (2016.08); *F21V 21/096* (2013.01);
*F21V 29/70* (2015.01);
(Continued)

(58) Field of Classification Search
CPC .... F21S 4/22; F21V 29/70; F21K 9/20; H01L 33/486
See application file for complete search history.

(56) References Cited

U.S. PATENT DOCUMENTS

| | | | | |
|---|---|---|---|---|
| 5,193,895 A | * | 3/1993 | Naruke | B60Q 1/323 362/800 |
| 2009/0256987 A1 | * | 10/2009 | Jeon | G02B 6/0091 349/65 |
| 2015/0003083 A1 | * | 1/2015 | Uehara | H05K 3/0058 362/418 |

FOREIGN PATENT DOCUMENTS

| | | |
|---|---|---|
| JP | 2015038868 | 2/2015 |
| KR | 1020100057001 | 5/2010 |

(Continued)

OTHER PUBLICATIONS

PCT International Application No. PCT/KR2018/014020, International Search Report dated Jul. 22, 2019, 4 pages.

*Primary Examiner* — Rajarshi Chakraborty
*Assistant Examiner* — Nathaniel J Lee
(74) *Attorney, Agent, or Firm* — Lee, Hong, Degerman, Kang & Waimey PC

(57) ABSTRACT

The present application provides an LED film module installable on a surface having various shapes. The present application provides a flexible LED film module comprising: a flexible LED film; and a mounter provided on the flexible LED film so as to install the flexible LED film on a predetermined surface, and formed to be deformable according to the shape of the predetermined surface, wherein the mounter comprises: a base; and a supporter disposed along the edge of a plate and extending to a predetermined height from the base so as to support the flexible LED film to be spaced apart from the base.

15 Claims, 12 Drawing Sheets

(51) Int. Cl.
*F21V 21/096* (2006.01)
*F21K 9/20* (2016.01)
*H01L 33/48* (2010.01)
*F21Y 105/16* (2016.01)
*F21Y 115/10* (2016.01)

(52) U.S. Cl.
CPC ........ *H01L 33/486* (2013.01); *F21Y 2105/16* (2016.08); *F21Y 2115/10* (2016.08)

(56) References Cited

FOREIGN PATENT DOCUMENTS

| KR | 1020120019742 | 3/2012 |
| KR | 1020160064772 | 6/2016 |
| WO | 2014184440 | 11/2014 |

\* cited by examiner (a)

(b)

(a)

(b)

FLEXIBLE LED FILM MODULE

CROSS-REFERENCE TO RELATED APPLICATIONS

This application is the National Stage filing under 35 U.S.C. 371 of International Application No. PCT/KR2018/014020, filed on Nov. 15, 2018, which claims the benefit of earlier filing date and right of priority to Korean Application No. 10-2018-0128776, filed on Oct. 26, 2018, the contents of which are all hereby incorporated by reference herein in their entirety.

TECHNICAL FIELD

The present disclosure relates to a flexible LED film, and more particularly, to a component or assembly configured to install the LED film on a predetermined position.

BACKGROUND ART

An LED film is a display device in which a light emitting diode (hereinafter, 'LED') is installed on a thin film as a light source. The LED film may include a plurality of LEDs, and may display an intended image by operating the LEDs in accordance with a driving signal transferred from the outside. Since the LED film is wholly made of a film, the LED film is thin and light and may have a flexible structure. Also, the film of the LED film may be made of a transparent material, and in this case, the LED film may be transparent on the whole. Therefore, the LED film may easily be installed on various kinds of surfaces for various purpose of uses. For example, the LED film may be installed on an outer wall of a building or a transparent glass to provide predetermined image information including advertisement.

Particularly, owing to these features, the LED film is applied to a curved surface of various shapes on which general displays are difficult to be displayed. However, when the LED film is installed on the curved surface, it is general that a fixture is used due to structural features of the LED film. That is, the LED film and the fixture are formed as one module to be installed on the curved surface. Therefore, the fixture needs to be improved such that the LED film is stably attached onto the curved surfaces of various shapes.

Also, the LED film is recently applied to implement a large scaled screen. In this case, since it is difficult to make one LED film having a large scaled screen, a plurality of small sized LED films may be combined to form such a large scaled screen. However, since installation and maintenance of the plurality of LED films may cause many problems regardless of surfaces (that is, plane or curved surface) on which the films are installed, the problems need to be solved properly.

DISCLOSURE

Technical Problem

The present application is intended to solve the aforementioned problems, and an object of the present application is to provide a flexible LED film module that may stably be installed on a curved surface.

Another object of the present application is to provide a flexible LED film module that may easily be installed and maintained and repaired.

Technical Solution

To achieve the aforementioned objects, the present application may provide a flexible LED film module comprising: a flexible LED film; and a mounter provided on the flexible LED film so as to install the flexible LED film on a predetermined surface, and configured to be deformable in accordance with a shape of the predetermined surface, wherein the mounter comprises: a base; and a supporter disposed along the edge of a plate and extended from the base at a predetermined height to support the flexible LED film to be spaced apart from the base.

The supporter may be comprised of a plurality of columns extended from the base at a predetermined height and spaced apart from each other at a predetermined interval.

The mounter may include a recess disposed inside the supporter and configured to accommodate a control component of the flexible LED film. The mounter may include a coupling mechanism disposed inside the recess and configured to couple the control component to the mounter. The coupling mechanism may be disposed on a center line of the mounter to allow the control component not to be deformed together with the mounter which is deformed.

In more detail, the coupling mechanism may include a fixed rod protruded from the base of the mounter at a predetermined height; and a holder coupled to the fixed rod and configured to hold the control component to be spaced apart from the base. Also, the coupling mechanism may further include a boss extended from the base at a predetermined height to surround the fixed rod and configured to support the control component.

Meanwhile, the flexible LED film module may further comprise a fixed plate interposed between the mounter and the surface and configured to couple the mounter to the surface. The fixed plate may be fixed to the surface so as not to move, and the mounter may movably be coupled to the fixed plate. Also, the supporter may include an outer side inclined toward the outside of the supporter.

Also, the flexible LED film may be configured to be detachably coupled to the mounter. In more detail, the flexible LED film may further include a heat sink provided on a rear surface of the flexible LED film, having high thermal conductivity and magnetism, and the supporter may further include a magnetic body provided on a front surface of the supporter and configured to attract the heat sink. In another aspect, the flexible LED film may further include a protrusion provided on a rear surface of the flexible LED film, having magnetism, and the supporter may further include a recess provided on a front surface of the supporter, including a magnetic body attracting the protrusion.

Also, the mounter may include a first channel formed in the supporter and configured to allow a cable connecting the control component with another external control component to pass therethrough. The mounter may include a second channel formed in the supporter and configured to allow a terminal connecting the flexible LED film with the control component to pass therethrough.

Advantageous Effects

The LED film module of the present application may include a mounter configured to be coupled onto a predetermined surface while supporting an LED film. The mounter is configured to be deformable, and may support the LED film to be spaced apart from a predetermined surface for active air flow and easy accessibility in the vicinity of the LED film. Therefore, the LED film module may stably and easily be installed on a predetermined surface comprised of a changed shape, for example, a curved surface.

Also, the mounter may be configured to embed a control component of the LED film module therein, and may detachably couple the LED film to the control component. The LED film may easily be detached from the mounter for repair and exchange, and the control component embedded in the mounter may easily be repaired and exchanged after detaching the LED film. Therefore, the LED film module may easily and efficiently be maintained and repaired.

BEST MODE FOR CARRYING OUT THE INVENTION

Figure 1:
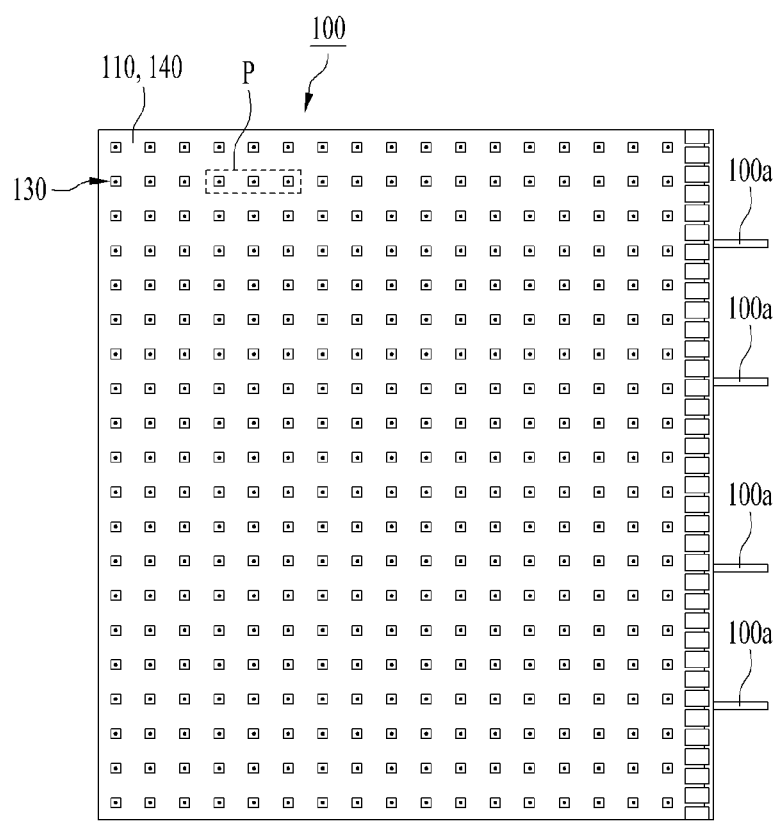
FIG. 1 is a plane view illustrating an LED film of a flexible LED film module according to the present application.

Reference will now be made in detail to the preferred embodiments of the present disclosure, examples of which are illustrated in the accompanying drawings.

Wherever possible, the same reference numbers will be used throughout the drawings to refer to the same or like parts. The suffixes "module" and "unit" for the elements used in the following description are given or used in common by considering facilitation in writing this disclosure only but fail to have meanings or roles discriminated from each other. Also, in description of the embodiments disclosed in this specification, if detailed description of the disclosure known in respect of the present disclosure is determined to make the subject matter of the embodiments disclosed in this specification obscure, the detailed description will be omitted. Also, the accompanying drawings are only intended to facilitate understanding of the embodiments disclosed in this specification, and it is to be understood that technical spirits disclosed in this specification are not limited by the accompanying drawings and the accompanying drawings include all modifications, equivalents or replacements included in technical spirits and technical scope of the present disclosure.

Although the terms such as "first" and/or "second" in this specification may be used to describe various elements, it is to be understood that the elements are not limited by such terms. The terms may be used to identify one element from another element.

The expression that an element is "connected" or "coupled" to another element should be understood that the element may directly be connected or coupled to another element, a third element may be interposed between the corresponding elements, or the corresponding elements may be connected or coupled to each other through a third element. On the other hand, the expression that an element is "directly connected" or "directly coupled" to another element" means that no third element exists therebetween.

It is to be understood that the singular expression used in this specification includes the plural expression unless defined differently on the context.

In this application, it is to be understood that the terms such as "comprise", "include" and "has" are intended to designate that features, numbers, steps, operations, elements, parts, or their combination, which are disclosed in the specification, exist, and are intended so as not to previously exclude the presence or optional possibility of one or more other features, numbers, steps, operations, elements, parts, or their combinations. Also, for the same reason, it is to be understood that the present application includes a combination of features, numbers, steps, operations, elements and parts, which are partially omitted from the combination of features, numbers, steps, operations, elements and parts, which are described using the aforementioned terms, unless it departs from intended technical objects and effects.

The embodiments described in the present specification relate to a device for installing an LED film. However, it will be apparent to those skilled in the art that the principles and configuration of the described embodiments may substantially equally be applied to the other flexible flat displays different from the LED film.

Figure 2:
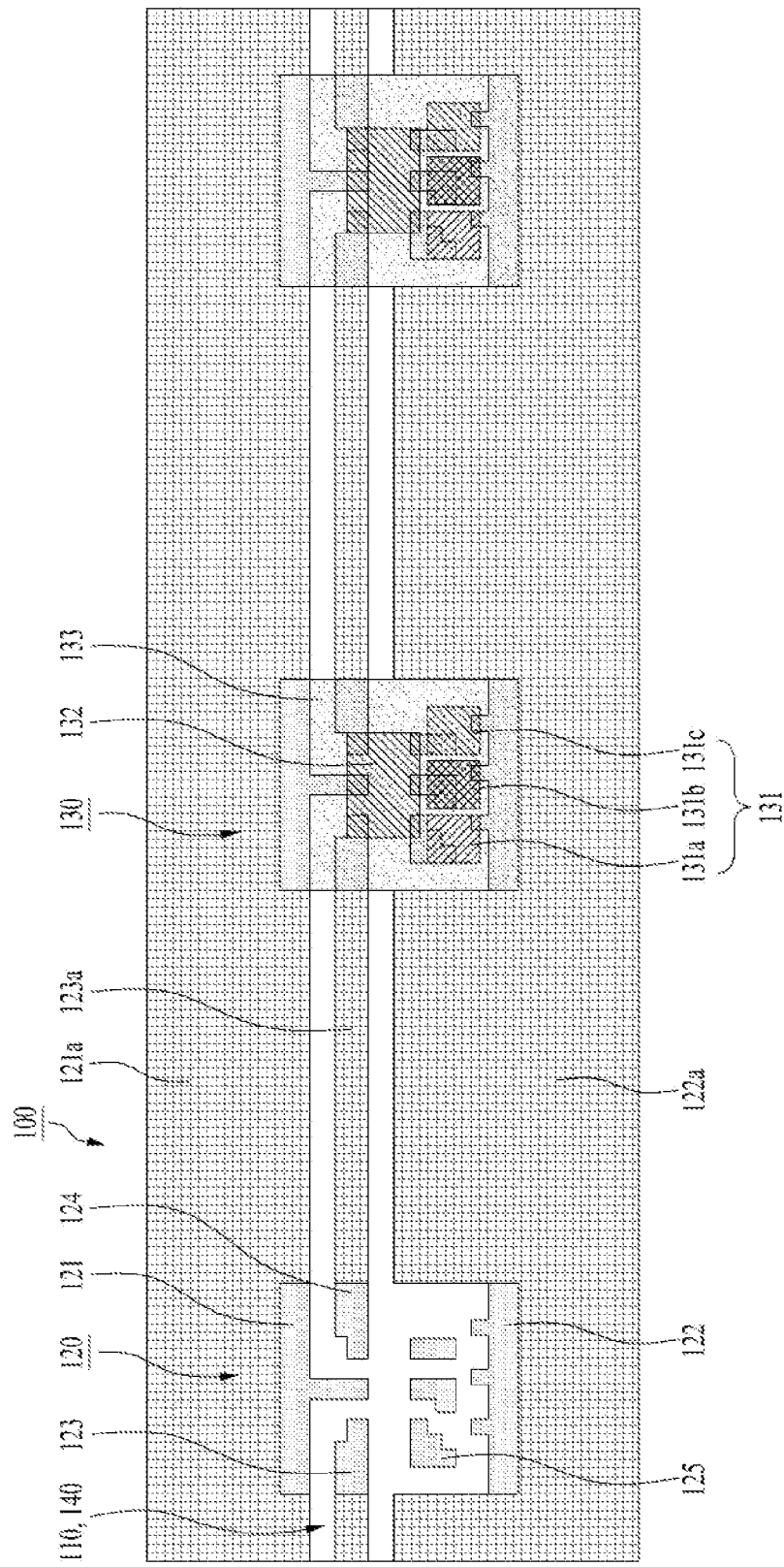
FIG. 2 is a partially enlarged view illustrating a region P of FIG. 1.

FIG. 1 is a plane view illustrating an LED film of a flexible LED film module according to the present application, and FIG. 2 is a partially enlarged view illustrating a region P of FIG. 1.

First of all, referring to FIGS. 1 and 2, the flexible LED film module of the present application may include a flexible LED film 100 (hereinafter, "LED film"). The LED film 100 may be configured to generate image information by using LED as a light source.

The LED film 100 may include a film 110 of a predetermined size. The film 110 serves as a platform in which other components of the LED film 100 are installed, and may have various sizes in accordance with purpose of use. The film 110 has a thin thickness and may be made of a light flexible material, for example, any one of various flexible polymer compounds. Therefore, the LED film 100 may easily be deformed due to such a characteristic of the film 110, and therefore, may be attached onto a surface of various shapes, for example, a surface having a predetermined curvature. Also, the film 110 may be made of a transparent material, and therefore the LED film 100 may be configured transparently on the whole. Since the transparent LED film 100 does not reduce transparency of the attached portion, the LED film 100 may be applied to a window of a building. Also, if the transparent LED film 10 is applied to the window, a user may view an image displayed through the window. The film 110 may include a terminal 100a installed at any one end thereof. The terminal 100a is connected to an external device and an external power, and may also be connected with internal components of the LED film 100.

Therefore, the terminal 100a may receive a driving signal, that is, a video signal and a power (or voltage) from the external device and the power and supply the driving signal to the internal components. For example, the terminal 100a may be comprised of a flexible body and a plurality of circuits disposed in the body, that is, a flexible PCB or film PCB, and may easily be connected to the external device and the external power while being deformed by flexibility.

Also, as well shown in FIG. 2, the LED film 100 may include a main electrode 120 provided on the film 110. The main electrode 120 may be made of a thin layer of a conductive material, and may have a predetermined pattern to be suitable for transferring a power and a signal to predetermined components, that is, light source modules 130, which will be described later. In more detail, the electrode 120 may include a first power electrode 121 for supplying + power or voltage and a second power electrode 122 for supplying − power or voltage. Also, the electrode 120 may include a first signal electrode 123 for inputting data, that is, a driving signal, and a second signal electrode 124 configured to output the driving signal. The first and second signal electrodes 123 and 124 may be connected to a control integrated circuit (IC) 132, which will be described later, to control the operation of the light source modules 130. Likewise, the control IC 132 may be connected with an LED chip 131, which will be described later, by a connection electrode 125 of the electrode 120 to control the operation of the LED chip 131.

Meanwhile, the electrode 120 may be connected with the terminal 100a by intermediate electrodes 121a, 122a and 123a to receive an external power and a signal. The intermediate electrodes 121a, 122a and 123a, as shown in FIG. 2, may be made of a thin mesh member, and may longitudinally be extended from the electrode 120 to the terminal 100a along the film 110. In the electrode 120, the power, the signal and the connection electrodes 125 may be exposed to the outside of the film 110 for connection with the light source modules 130 but the intermediate electrodes 121a, 122a and 123a may be protected by being embedded in the film 110. As shown in FIG. 1, the LED film 100 needs a plurality of pixels, that is, the light source modules 130 to implement the intended image. Likewise, a plurality of electrodes 120 respectively corresponding to the light source modules 130 may be provided on the film 110. Therefore, the intermediate electrodes 121a, 122a and 123a may mutually connect the electrodes 120 adjacent to each other, especially the electrodes 120 included in the same row. In more detail, the first intermediate electrode 121a may mutually connect the first power electrodes 121 adjacent to each other, and the second intermediate electrode 122a may mutually connect the second power electrodes 122 adjacent to each other. Therefore, the power supplied to the terminal 100a may simultaneously be supplied to the first and second power electrodes 121 and 122 by the first and second intermediate electrodes 121a and 122a. Also, the third intermediate electrode 123a may mutually connect the first and second signal electrodes 123 and 124 adjacent to each other, and therefore, the driving signal supplied from the terminal 10a may be relayed by passing through the electrodes 120 through repetition of input/output based on the signal electrodes 123 and 124.

The LED film 100 may also include a light source module 130 configured to emit light. The light source module 130 emits light in accordance with the driving signal and the power, and may be connected to the main electrode 120 to receive the signal and the power, which are required. Since loss may occur if a connection path between the electrode 120 and the module 130 becomes long, the light source module 130 may directly be disposed on the main electrode 120 as shown in FIG. 2 to reduce the connection path and then connected to the main electrode 120. A plurality of pixels are required for the LED film to implement the intended image. Therefore, each of the light source modules 130 acts as one pixel, and may be disposed on the corresponding electrode 120 as shown in FIG. 1. Also, the light source modules 130 may be spaced apart from each other at a certain interval to obtain an image of high quality, thereby forming one matrix.

Referring to FIG. 2, the light source module 130 may basically include an LED chip configured to emit light of a predetermined color. The LED chip 131 may include a substrate and semiconductor layers deposited on the substrate, emitting light in accordance with a power or voltage applied thereto. The LED chip 131 may include electrodes connected with the semiconductor layers to supply the power or voltage to the semiconductor layers. Also, the LED film 100 may implement a color image by using the light source module 130. In this case, the LED chip 131 may include a plurality of LED chips 131a, 131b and 131c configured to generate light of different colors. For example, the LED chip 131 may include a first chip 131a generating light of a red color, a second chip 131b generating light of a green color, and a third chip 131c generating light of a blue color. Also, the light source module 130 may include a control IC 132 configured to control the operation of the LED chip 131. The control IC 132 may control the operation of the LED chip 131 by controlling the power and signal supplied through the electrode 120. Therefore, the control IC 132 may generate light of an intended color from the light source module 130, exactly the LED chip 131. Since the LED chip 131 and the control IC 132 perform an intended single function, that is, a function of a single pixel, they may structurally be formed as one module. In more detail, the LED chip 131 and the control IC 132 may be installed on the substrate 133, and the substrate 133 may include an electrode configured to connect the electrode 120 with the chips 131 and 132 (exactly their electrodes). Therefore, the LED chip 131, the control IC 132 and the substrate 133 may be formed as one module, that is, the light source module 130.

A sealing layer 140 may finally be deposited on the film 110, the electrode 120 and the light source module 130, which are fixed to one another. The film 110, the electrode 120 and the light source module 130 may be protected from an external object and impact by the sealing layer 140 when used.

As described above, since the LED film 100 is thin, light and flexible, the LED film 100 may be attached to a curved surface as well as a plane. Since the curved surface accompanies a shape change unlike the plane, a general fastening member needs to be used for the LED film 100 such that the LED film 100 may stably be attached to the curved surface without be detached therefrom. However, since the LED film 100 does not have high structural strength, it is not preferable to directly form a fastening hole in the LED film 100 or apply the fastening member to the LED film 100. Also, the case that the fastening hole is formed in the LED film 100 or the fastening member is exposed from the LED film 100 may deteriorate an external appearance. Moreover, as discussed in the aforementioned related art, if the plurality of LED films 100 are combined for a large scaled screen, it is not easy to directly install the films 100 on the intended surface regardless of the curved surface or the plane, and it is not easy to detach the films 100 from the intended surface for maintenance, either. For this reason, instead of directly installing the LED film 100 to the intended surface, a fixture interposed between the LED film 100 and the surface is applied to install the LED film 100 on the surface. The LED film module of the present application includes a mounter 200 as a fixture.

Figure 3:
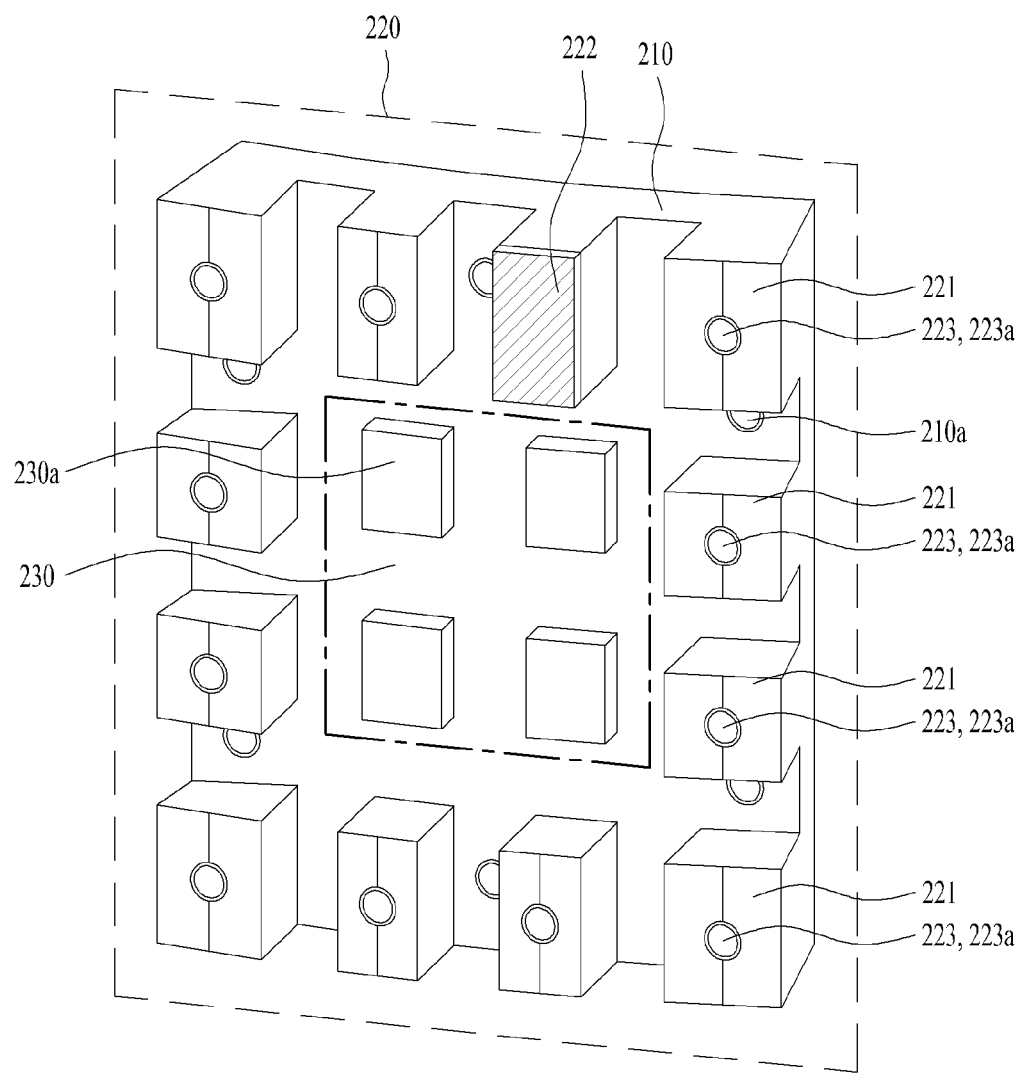
FIG. 3 is a perspective view illustrating a mounter of a flexible LED film module according to the present application.
Figure 4:
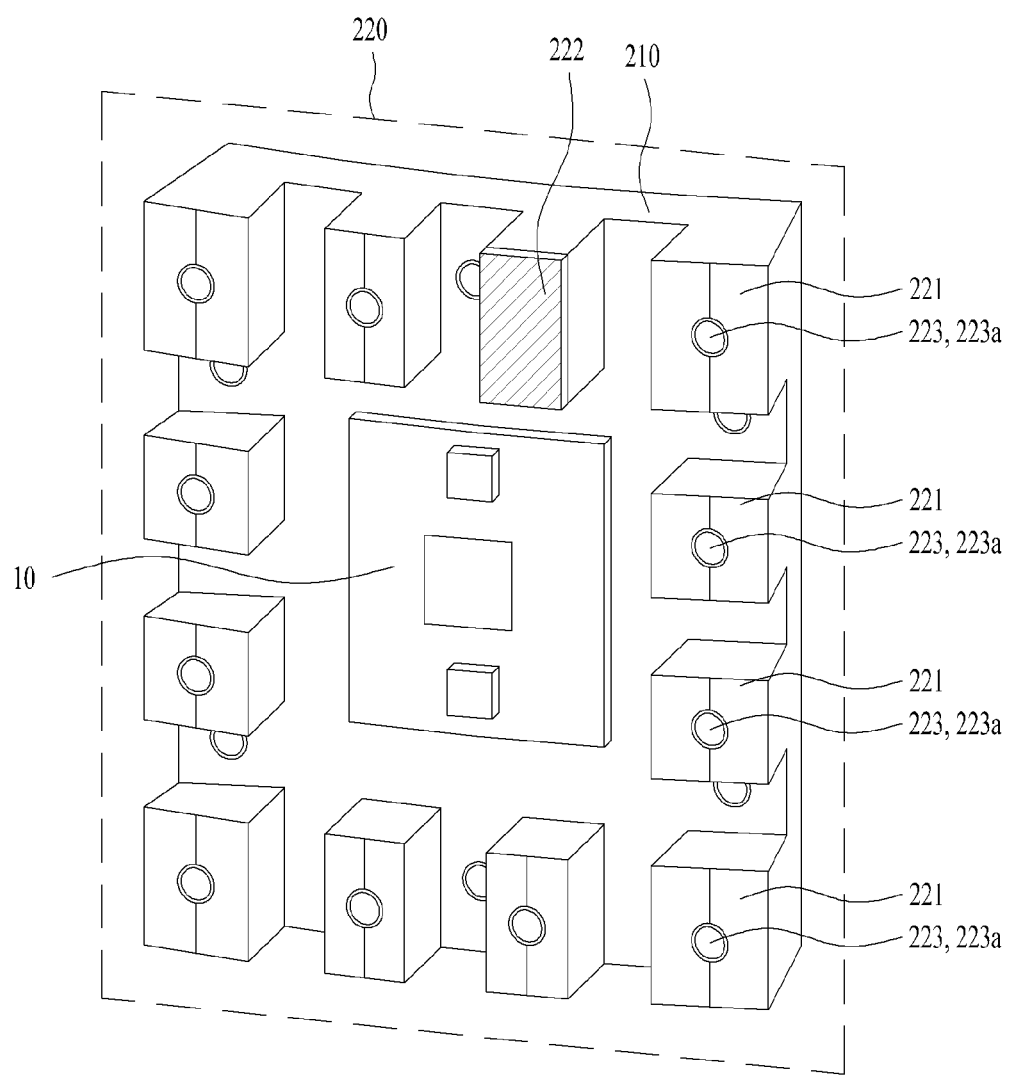
FIG. 4 is a perspective view illustrating a mounter on which a control component of an LED film is installed.

FIG. 3 is a perspective view illustrating a mounter of a flexible LED film module according to the present application, and FIG. 4 is a perspective view illustrating a mounter on which a control component of an LED film is installed. The mounter 200 will be described in detail with reference to these drawings.

The mounter 200 may be provided to the LED film 100 to install the LED film 100 on a predetermined surface. As described above, since the LED film 100 generates an image on a front surface, that is, a first surface, the mounter 200 may be provided on a second surface, for example, a rear surface, which is not configured to provide an image. Therefore, the mounter 200 may install the second surface on an intended predetermined surface while exposing the first surface of the LED film 100 to the outside. For this installation, the mounter 200 may generally have the same size as that of the LED film 100. However, the mounter 200 may have a size smaller than that of the LED film 100 if necessary, but is not formed to be greater than the LED film such that it is not exposed to the outside.

Also, if the intended surface, that is, the surface (hereinafter, "installation surface') where the LED film 100 will be installed includes a shape change, for example, if the surface is comprised of a curved surface, the LED film 100 may be changed in accordance with a shape of the surface due to its thin and flexible structural feature as described above. Likewise, in order to stably support the LED film 100, the mounter 200 may be configured to be deformed in accordance with the shape of the installation surface. The mounter 200 may be made of a flexible material, for example, any one of various flexible polymer compounds to be deformable in the same manner as the LED film 100.

In more detail, the mounter 200 may include a base 210. The base 210 may generally be comprised of a plate member having the same size as that of the LED film 100 to stably support the LED film 100 as described above. The base 210 may be formed of a flexible material to be elastically deformable in accordance with the shape of the installation surface. Also, the base 210 may include a fastening hole 210*a* formed in its body, and may be coupled onto the installation surface by using the fastening hole 210*a* and the fastening member inserted into the fastening hole 210. Therefore, the LED film 100 may directly be disposed on and coupled to the base 210 such that it is installed on the installation surface.

However, the LED film 100 may emit heat in the middle of operation due to the light source module 130 built therein. If the LED film 100 is directly disposed on the base 210, the LED film 100 is disposed to be close to the installation surface, and if the LED film 100 is disposed to be close to the installation surface, the LED film 100 cannot emit light effectively. Also, if the LED film 100 is disposed to be too close to the installation surface, it may be difficult to approach the LED film 100 or detach the LED film 100 from the installation surface for maintenance. For this reason, the mounter 200 may include a supporter 220 configured to support the LED film 100 to be spaced apart from the base 210. In FIGS. 3 and 4, the supporter 220 is marked by a dotted line as a member within a limited region. As shown, the supporter 220 may be extended from the base 210 at a predetermined length or height, and may be configured such that its end, that is, front surface is in contact with the rear surface of the LED film 100, that is, the second surface. Also, in the same manner as the base 210, the supporter 220 may be made of a flexible material which is elastically deformable. Therefore, the supporter 220 may support the LED film 100 to be sufficiently spaced apart from the installation surface as well as the base 210 while being deformed to be suitable for the installation surface, thereby enabling effective heat emission and easy maintenance of the LED film 100.

Also, if the supporter 220 is formed over the entire surface of the base 210, a volume of the mounter 200 becomes too great and the mounter 200 may be difficult to be deformed. Therefore, the supporter 220 may preferably be formed at only a part of the base 210. In more detail, the supporter 220 may be disposed to be extended along the edge of the base 210 as shown in FIGS. 3 and 4. The supporter 220 may stably support the LED film 100 while fully adjoining the edge of the LED film 100, wherein the LED film 100 faces the supporter 220. Also, since the supporter 220 is only formed at the edge of the base 210, the supporter 220 may easily be deformed together with the base 210. Therefore, the supporter 220 may achieve other intended functions, that is, heat emission and maintenance of the LED film 100 while enabling basic functions of the mounter 200, that is, stable support and easy deformation. Moreover, the supporter 220 disposed at the edge of the base 210 may be made of a continuous member. However, in this case, the supporter 220 may resist deformation due to the continuous structure, and may disturb easy deformation of the mounter 200. For this reason, the supporter 200, as shown in FIGS. 3 and 4, may be comprised of a plurality of columns 221 detached from each other. In more detail, the columns 221 may be extended from the base 210 at a predetermined length or height and spaced apart from one another at constant intervals. That is, clearances of a predetermined size may be disposed in the supporter 220 at a predetermined interval, and the plurality of columns 221 may relatively be formed in the supporter 220 due to the clearances. The clearances may be extended to an end that faces the LED film 100 of the supporter 220 and divide the supporter 220 into a plurality of sections having ends detached from each other, that is, columns 221, wherein the ends of the supporter 220 may again be connected with the LED film 100. That is, the columns 221 may include first ends connected to the base 210 and second ends connected with the LED film 100. In this way, as the supporter 220 is comprised of the columns 221 detached from each other, the supporter 220 may more easily be deformed together with the base 210 in accordance with the installation surface while stably supporting the LED film 100. Also, the external air may move into the mounter 200 through the clearances formed between the columns 221, and the LED film 100 may exchange heat with the moving air through a wider area. Also, a worker may more easily approach the LED film 100 through the clearances. Therefore, cooling and maintenance of the LED film 100 may be performed more effectively due to the aforementioned structure of the columns 221. Although FIGS. 3 and 4 show that the columns 221 have a rectangular section, the columns 221 may have another shaped section such as a circular or triangular section if necessary. Since the columns 221 are a part of the supporter 220 structurally, all features of the supporter 220 which will be described below may equally be applied to the columns 221.

Also, the LED film 100 may have a component 10 disposed outside to control its operation. This control component 10 may be a control board as shown in FIGS. 3 and 4 as an example. The control board may control an externally received digital video signal, for example, a source signal and properly transmit the signal to the LED film 100, so that the LED film may exactly implement an image. The control board may include a control circuit configured to control the video signal, and the control circuit may be comprised of a processor and related electric/electronic components. The circuit and components may be mounted on a printed circuit board (PCB) of a predetermined size as shown. The control board may generally be referred to as a T-Con board or control PCB in the corresponding technical field. The control component 10 including the control board needs to be disposed to adjoin the LED film 100 to perform an intended function. As described above, since the supporter 220 in the mounter 200 is extended from the edge of the base 210 at a predetermined height, a recess 230 of a predetermined size may be formed at the center of the mounter 200 relatively to the supporter 220. The recess 230 may be suitable for accommodating the control component 10 of the LED film 100, that is, the control board. In more detail, the base 210 may be a bottom portion of the recess 230, and the supporter 220 may form a sidewall of the recess 230. That is, the mounter 200 may include a recess 230 as an accommodating space of a predetermined size disposed inside the supporter 220. Therefore, the control component 10, for example, the control board may be accommodated in the recess 230. That is, the mounter 200 may be configured to accommodate the control component 10 due to the recess 230. Hereinafter, although the control board will be mentioned as the control component 10 accommodated in the recess 230, the recess 230 may be configured to accommodate control components different from the control board.

The control component 10 accommodated in the recess 230 needs to be fixed in the recess 230 so as not to be damaged or interfere with the LED film 100 adjacent thereto. Therefore, the mounter 200 may include a first coupling mechanism 230a disposed in the recess 230 and configured to couple the control component 10 to the mounter 200. In more detail, the first coupling mechanism 230a may be provided in the base 210 inside the recess 230 and configured to couple the control component 10 onto the base 210. The first coupling mechanism 230a, as well shown in FIGS. 3 and 4, may be comprised of a platform formed on a portion of the surface of the base 210 corresponding to the bottom portion of the recess 230 and protruded from the base 210 at a predetermined height or length. The platform may have a flat end to stably support the control component 10. Also, the platform is not protruded from the supporter 220 (that is, column 221), that is, the platform is not higher than the supporter 220 or is not extended to be longer than the supporter 220. Instead, the platform is extended to be lower than the supporter 220, whereby the control component 10 coupled to the platform may not interfere with the LED film 100 installed on the supporter 220. Moreover, the control component 10 may be spaced apart from the base 210 at a predetermined interval by the extended platform. This may be favorable for heat emission and cooling of the control component 10. The first coupling mechanism 230a, as shown, may include a plurality of platforms spaced apart from one another to more stably support and fix the control component 10. As an example, the control component 10 may directly be attached to the first coupling mechanism 230a, that is, the platform by using an adhesive or may be fixed to the first coupling mechanism 230a by a fastening member, and another coupling method may be applied to this case.

The control component 10 may stably be accommodated in the mounter 200 and coupled to the mounter 200 by using the first coupling mechanism 230a. However, as shown in FIGS. 3 and 4, if the first coupling mechanism 230a, that is, a coupling unit of the control component 10 is widely formed or distributed on the mounter 200, exactly the base 210, this is favorable for stable support of the control component 10 but the first coupling mechanism 230a and the control component 10 coupled to the first coupling mechanism 230a should be deformed together with the mounter 200 when the mounter 200 is deformed to be matched with the shape of the installation surface, that is, the curved surface. Since the first coupling mechanism 230a, that is, the platform is formed of a deformable material as a part of the mounter 200, the first coupling mechanism 230a may sufficiently be deformed in accordance with the installation surface. On the other hand, since it is general that the control component 10 is not a component configured to enable big deformation, the control component 10 may disturb deformation of the mounter 200. Also, the control component 10 may be damaged or disordered by deformation. Therefore, in the LED film module of the present application, the mounter 200 may include a second coupling mechanism configured to fail to generate deformation in the embedded control component 10, instead of the first coupling mechanism 230a. The second coupling mechanism will be described with reference to the following drawings.

Figure 5:
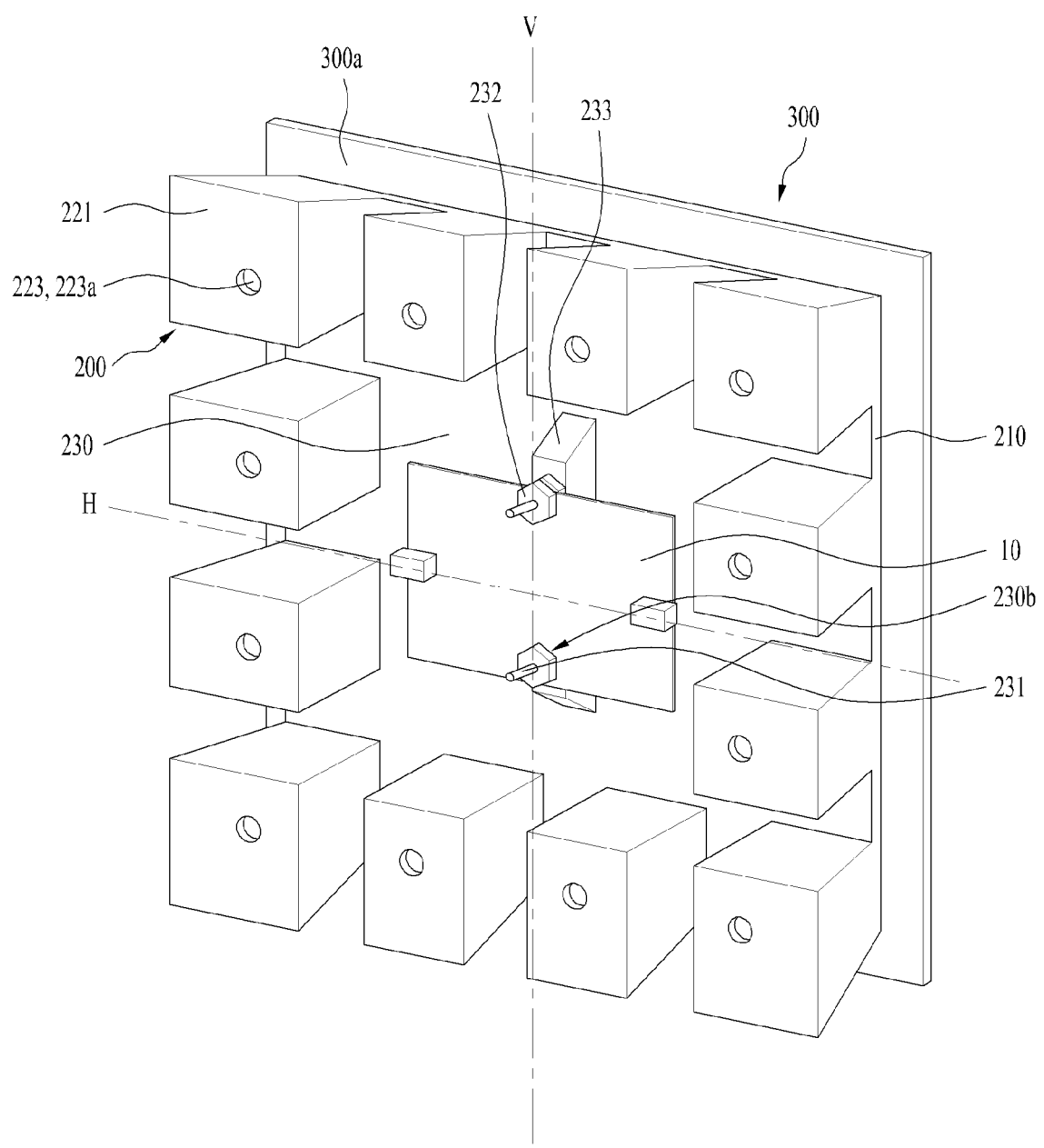
FIG. 5 is a perspective view illustrating a mounter of a flexible LED film module and an assembly of a fixed plate according to the present application.
Figure 6:
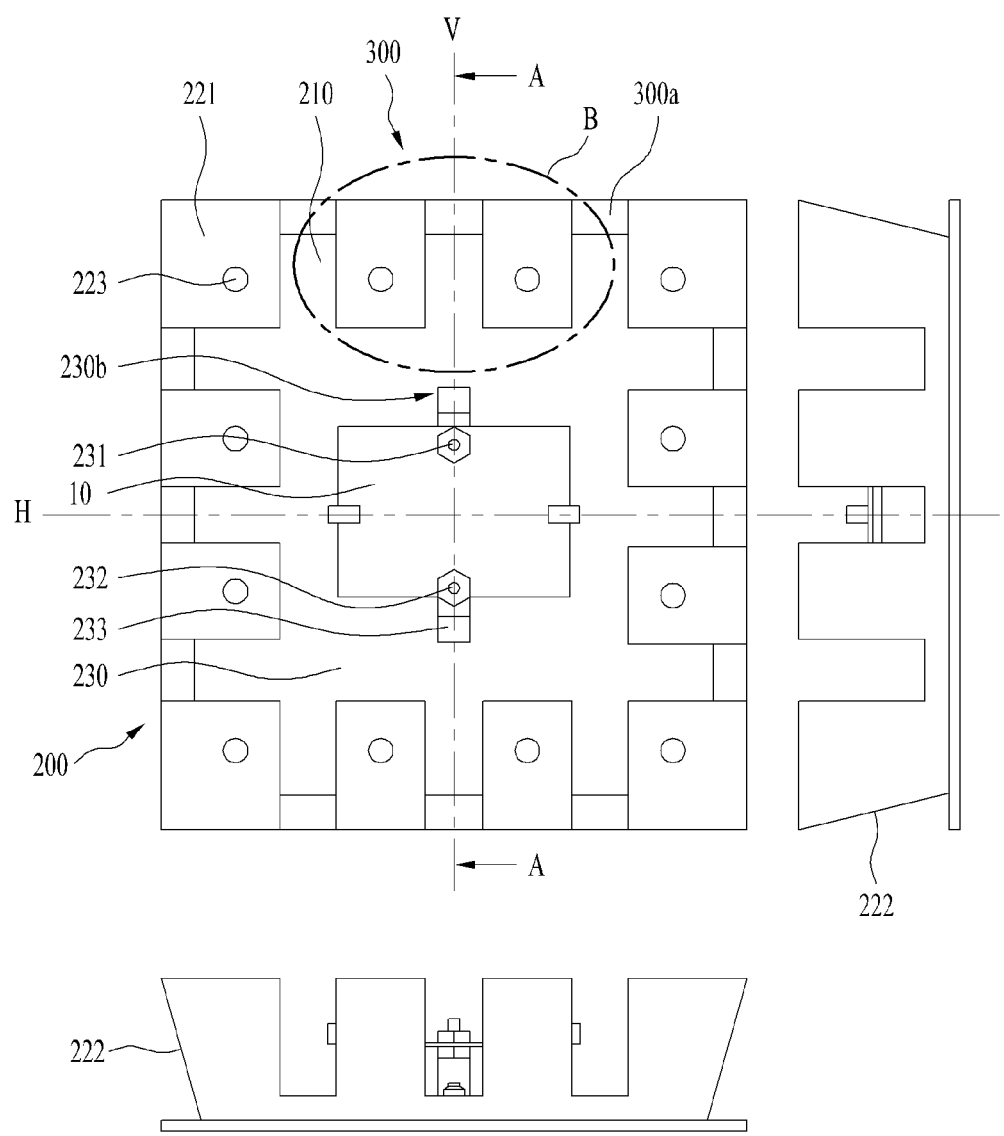
FIG. 6 are a plane view and a side view illustrating the mounter and the assembly of the fixed plate in FIG. 5.
Figure 7:
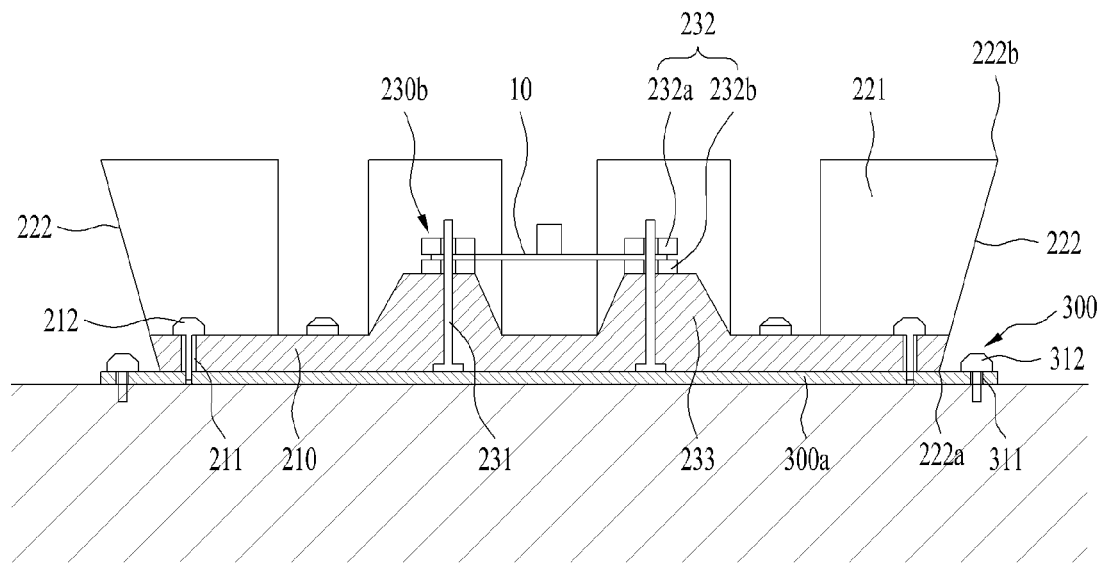
FIG. 7 is a cross-sectional view taken along line A-A of FIG. 6.

FIG. 5 is a perspective view illustrating a mounter of a flexible LED film module and an assembly of a fixed plate according to the present application. Also, FIG. 6 are a plane view and a side view illustrating the mounter and the assembly of the fixed plate in FIG. 5. FIG. 7 is a cross-sectional view taken along line A-A of FIG. 6.

If the mounter 200 is deformed to be suitable for the installation surface which is a curved surface, the mounter 200 is deformed based on a center line of a vertical or horizontal direction. Unlike the other portions of the mounter 200 deformed or moved by deformation, the portion corresponding to the center line of the mounter 200 is little deformed and is not moved by deformation. That is, if the mounter 200 is deformed based on the center line, deformation or dislocation does not occur in the portion near the center line. For this reason, the mounter 200 may include a second coupling mechanism 230b configured to be disposed on the center line of the mounter 200. Also, if the second coupling mechanism 230b is substantially enlarged or extended from the center line, even though the second coupling mechanism 230b is disposed on the center line, the second coupling mechanism 230b and the control component 10 coupled to the second coupling mechanism 230b may be subjected to deformation when the mounter 200 is deformed. Therefore, the second coupling mechanism 230b may be configured to be extended along the center line so as not to be greatly enlarged from the center line. As described above, if the second coupling mechanism 230b is disposed and extended along a predetermined center line of the mounter 200 and the mounter 200 is deformed based on the predetermined center line, the control component 10 coupled to the second coupling mechanism 230b may not be subjected to deformation or dislocation. Therefore, the mounter 200 may easily be deformed while embedding the control component 10 therein, and may prevent the control component 10 from being damaged or disordered.

In more detail, as shown in FIG. 7, the second coupling mechanism 230b may include a fixed rod 231 protruded from the base 210 of the mounter 200 at a predetermined height and a holder 232 coupled to the fixed rod 231 and configured to hold the control component 10. The fixed rod 231 may be comprised of a member formed in a single body with the base 210 or a member manufactured separately from the base 210 and inserted into the base 210 as shown. If the fixed rod 231 is comprised of a member manufactured separately, the fixed rod 231 may pass through the base 210 such that it may be protruded from the base 210. Also, the fixed rod 231 may include a flange formed at an end to be caught in the base 210, whereby the fixed rod 231 may not be detached from the base 210. Also, the fixed rod 231 is extended to be lower than the supporter 220 (that is, column 221) and therefore does not interfere with the LED film 100 installed on the supporter 200. The control component 10 coupled to the fixed rod 231 may not interfere with the LED film 100. The holder 232 may include a pair of first and second holders 232a and 232b coupled to the fixed rod 231. The holder 232 may be coupled to the fixed rod 231 in various manners, but may be coupled to the fixed rod 231 by screw coupling as an example. That is, the fixed rod 231 and the holder 232 may have screws respectively formed on their outer surface and inner surface, and the fixed rod 231 may be coupled to the first and second holders 232a and 232b by screw coupling while being inserted into the first and second holders 232a and 232b. The control component 10 may be disposed between the first and second holders 232a and 232b and therefore tightened by these holders. The end of the control component 10 may simply be fitted between the first and second holders 232a and 232b, and for stable coupling, may have a through hole into which the fixed rod 231. The first and second holders 232a and 232b may move while rotating on the fixed rod 231 by screw coupling. Therefore, the holders 232a and 232b may pressurize the control component 10 for stable fixture by controlling their interval. Also, the first and second holders 232a and 232b may dispose the control component 10 at a predetermined height from the base 210 while moving along the fixed rod 231. Therefore, the control component 10 may be spaced apart from the base 210 at a predetermined interval, and heat emission and cooling of the control component 10 may actively be performed. As well shown in FIGS. 5 and 6, a set of the rod 231 and the holder 232 may be disposed on the center line V to avoid deformation or dislocation of the control component 10 as described above. Also, for more stable coupling of the control component 10, the mounter 200 or the second coupling mechanism 230b may include sets of a pair of set of rod 231/holder 232. Even in this case, these sets may be disposed on the center line V to avoid deformation or dislocation.

Also, the second coupling mechanism 230b may include a boss 233 additionally provided to the base 210. The boss 233 may be extended from the base 210 at a predetermined height or length and configured to surround the fixed rod 231. That is, the fixed rod 231 may be supported by the boss 233 while additionally passing through the boss 233. Therefore, the fixed rod 231 and the control component 10 coupled to the fixed rod may more stably be supported by the boss 233. Also, an end of the boss 233 may be extended to the holder 232 to adjoin the holder 232. Therefore, the holder 232 and the control component 10 coupled to the holder may be disposed on the boss 233, and therefore may be supported by the boss 233 to maintain a predetermined height. This boss 233 may be provided to configure one set together with the rod 231 and the holder 232. Likewise, a pair of rod 231/holder 232/boss 232 may be provided for more stable coupling and support of the control component 10. Even in this case, as described above, each boss 233 may be disposed on the center line V together with the rod 231 and the holder 232 so as not to be subjected to deformation and/or dislocation. Also, since the boss 233 has a substantial volume unlike the rod 231 and the holder 232, as shown in FIGS. 5 and 6, the boss 233 may be extended along the center line V only. Therefore, since the boss 233 has a narrow width which is not enlarged to be gotten out of the center line V, the boss 233 may not be subjected to deformation and/or dislocation. In accordance with this configuration, even in the case that the second coupling mechanism 230b includes the boss 233, the control component 10 coupled to the second coupling mechanism 230b may not be subjected to deformation and/or dislocation, and its damage and disorder may be avoided.

In the aforementioned description of FIGS. 5 to 8 and related description, as an example, the second coupling mechanism 230b, that is, the rod, the holder and the boss 231 to 233 are disposed on a vertical center line V of the mounter 200. If the mounter 200 is deformed based on a horizontal center line H, the second coupling mechanism 230b is disposed on the horizontal center line H to avoid deformation and/or dislocation of the control component 10, and may be extended along the center line H.

Meanwhile, as described with reference to FIGS. 3 and 4, the mounter 200 may directly be coupled to the installation surface by using the fastening hole 210a and the fastening member. However, the mounter 200 is formed of a flexible material having high elasticity for deformation. Also, since the mounter 200 needs many processes to have the aforementioned supporter 220 and other structures, it may be difficult to be made of a material of high strength that is difficult to be processed. Therefore, if the mounter 200 is directly fixed to the installation surface, the mounter 200 may be damaged in the middle of being used for a long time. In another aspect, the mounter 200 directly fixed to the installation surface is difficult to move. Also, once the LED film 100 is coupled to the fixed mounter 200 to form one assembly, it may be difficult to change a relative position of the coupled LED film 100 within the assembly. However, if a plurality of LED modules that respectively include the assembly are combined, in order to form one large scaled screen that is continuous, the LED modules need to be installed while their interval is being controlled for various reasons. Therefore, considering these matters, the LED film module of the present application may be configured to further include a fixed plate 300 interposed between the mounter 200 and the installation surface. The fixed plate 300 and other additional features will be described with reference to related drawings.

Figure 8:
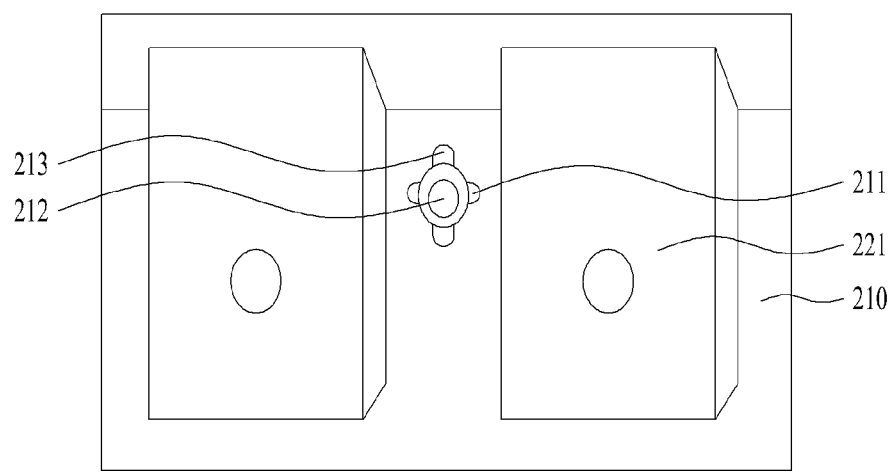
FIG. 8 is a partially enlarged view illustrating a region B of FIG. 6.
Figure 9:
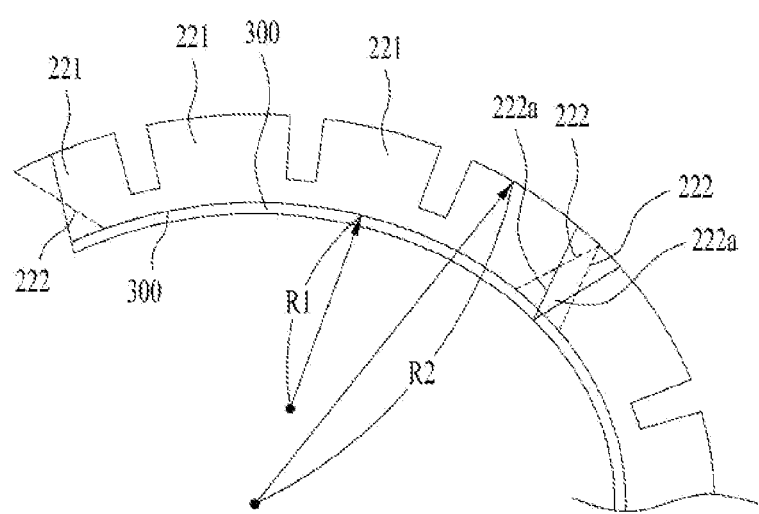
FIG. 9 is a brief view illustrating a function of an outer side of a supporter included in a mounter.

The following description will be given with reference to FIGS. 5 to 7 again and FIGS. 8 and 9 additionally. FIG. 8 is a partially enlarged view illustrating a region B of FIG. 6, and FIG. 9 is a brief view illustrating a function of an outer side of a supporter included in a mounter.

Referring to FIGS. 5 to 7, the fixed plate 300 may be comprised of a body 300a having the same size as that of each of the mounter 200 and the LED film 100 to support the mounter 200 and the LED film 100. The fixed plate 300 may have a thin thickness such that the LED film module has a compact size, and may be made of a material to be elastically deformable in accordance with a shape of the installation surface. However, the fixed plate 300 may be made of a material structurally having high strength and/or rigidity in addition to elasticity, and therefore sufficient structural strength/rigidity may be provided to the LED film module in spite of a thin flexible structure. Therefore, the fixed plate 300, as well shown in FIG. 7, may be interposed between the mounter 200 and the installation surface to stably couple the mounter 200 to the installation surface together with the LED film 100. In more detail, referring to FIG. 7, the fixed plate 300 may include a fastening hole 311 formed in the body 300a. The fastening member 312 may be fastened to the installation surface by passing through the fastening hole 311. Therefore, the fixed plate 300 may be fixed onto the installation surface without movement while rigidly supporting the other elements of the LED film module, that is, the LED film 100 and the mounter 200.

On the other hand, the mounter 200 may movably be coupled to the fixed plate 300. Since the fixed plate 300 is fixed onto the installation surface so as not to move, the mounter 200 may move together with the LED film 100 relatively to the fixed plate 300, and an interval between the LED film 100 and another LED film 100 adjacent thereto may be controlled. Therefore, an interval between adjacent LED film modules, exactly adjacent LED films 100 may be removed, whereby the plurality of LED film modules may implement one large scaled screen which is substantially continuous. In more detail, the mounter 200 may include a moving mechanism configured to enable such a movement. The mounter 200 may include a plurality of moving mechanisms to stably move. As in detail shown in FIG. 8, the mounter 200 may include a slot 211 formed in the base 210 and a pin 212 inserted into the slot 211 as the moving mechanisms. The slot 211 may longitudinally be extended in any one direction of the mounter 200, for example, in a horizontal direction as shown. Also, the pin 212 is a kind of fastening member, and may have one end inserted into the slot 211 and fastened to the fixed plate 300. Also, the pin 212 may include a head formed at the other end and greater than the slot 211. Once one end of the pin 212 is fastened to the fixed plate 300 at some level, the mounter 200 is not detached from the pin 212 due to the head of the other end. Afterwards, the mounter 200 may move along an extension direction of the slot 211 while being guided and supported by the pin 212 preparatorily fixed to the plate 300. If the mounter 200 is disposed at an exact position, the pin 212 may additionally be fastened to the fixed plate 300 to finally couple the mounter 200 to the fixed plate 300. Also, the mounter 200 may further include additional slot 213 longitudinally extended from the base 210 in a direction different from that of the slot 211, for example, in a vertical direction as shown. The additional slot 213 may be connected with the slot 213 for a change of a continuous moving direction of the mounter 200. Therefore, the mounter 200 may move to another direction by the additional slot 213, and the interval between the LED film modules adjacent to each other may be controlled more exactly. Moreover, the mounter 200 may additionally have a plurality of slots extended in their respective directions different from one another and connected with one another, and these slots may enable movement of the mounter 200 in various directions and a fine interval control between the LED film modules based on the movement of the mounter 200.

Also, since the supporter 220 has a size greater than that of each of the LED film 100 and the fixed plate 300 which are the other elements, when the LED film module is deformed to be matched with the installation surface, the supporter 220 may be deformed most greatly. Therefore, when the plurality of LED film modules are combined while being deformed, a clearance caused by deformation may be generated between the supporters 220 adjacent to each other. For example, as shown in FIG. 9 by a solid line, the supporter 220 may include an external side 222a generally vertical to the fixed plate 300 or the LED film 100. In this case, if the mounter 200 is deformed to be matched with the installation surface which is a curved surface, as shown, an outer portion of the mounter 200, which has a curvature radius R2 longer than that of an inner portion of the mounter 200, may be relatively less deformed, wherein the inner portion of the mounter 200 has a short curvature radius R1. Therefore, the outer side 222a of the deformed supporter 220 is inwardly inclined as marked in a solid line, and therefore a clearance is generated between the mounter 200 adjacent to the supporter 220 and the LED film 100 attached to the mounter 200. However, as marked in FIG. 9 by a dotted line, if the outer side 222 of the supporter 200 is formed to be previously inclined toward the outside, a clearance may not be generated between the deformed mounters 200 or a clearance may be minimized between the deformed mounters 200. That is, the outer side 222 inclined toward the outside and a portion adjacent to the outer side 222 may act as a gap filler filling the clearance between the deformed supporters 220. For this reason, as shown in FIGS. 5 to 7, the supporter 220 or the column 221 may include the outer side 222 inclined toward the outside. Also, since the supporter 222 substantially reserves most of the mounter 200 and forms a side portion of the mounter 200, it may be described that the mounter 200 includes the outer side 222 inclined toward the outside. In more detail, the outer side 222 may be extended to a front portion or front surface of the supporter 220 (or mounter 200) adjacent to the LED film 100 while being inclined from a rear portion or rear surface of the supporter 220 (or mounter 200) adjacent to the installation surface toward the outside. That is, the supporter 220 (or mounter 200) may include a first edge 222a of a rear portion or rear surface of the supporter 220 (or mounter 200) adjacent to the installation surface and a second edge 222b of a front portion or front surface of the supporter 220 (or mounter 200) adjacent to the LED film 100, wherein the second edge 222b may be disposed to be farther away from the center of the mounter 200 than the first edge 222a. Also, if the outer side 222 is extended to be inclined beyond the fixed plate 300, the mounter 200 may interfere with the supporters 220 already adjacent to each other before being deformed, exactly the outer sides 222 of the supporters. Therefore, the outer side 222 may be extended to be inclined to the fixed plate 300 as shown. That is, the second edge 222b may be disposed to be closer to the center of the mounter 200 than the edge of the fixed plate 300.

Meanwhile, the LED film 100 may be coupled to the mounter 200, more exactly the supporter 220 of the mounter 200, as described above. For example, an adhesive may be deposited on the rear surface of the LED film 100 or the front surface of the supporter 200, and the LED film 100 may be coupled to the mounter 200 by this adhesive. However, since the light source module 130 of the LED film 100 has a predetermined lifespan, the LED film 100 needs to be periodically exchanged with new one. Also, the LED film 100 needs to be detached from the mounter 200 for repair even in the case that disorder or damage occurs. For this reason, in the LED film module of the present application, the LED film 100 is configured to be detachably coupled to the mounter 200, and will be described in detail with reference to its related drawing.

Figure 10:
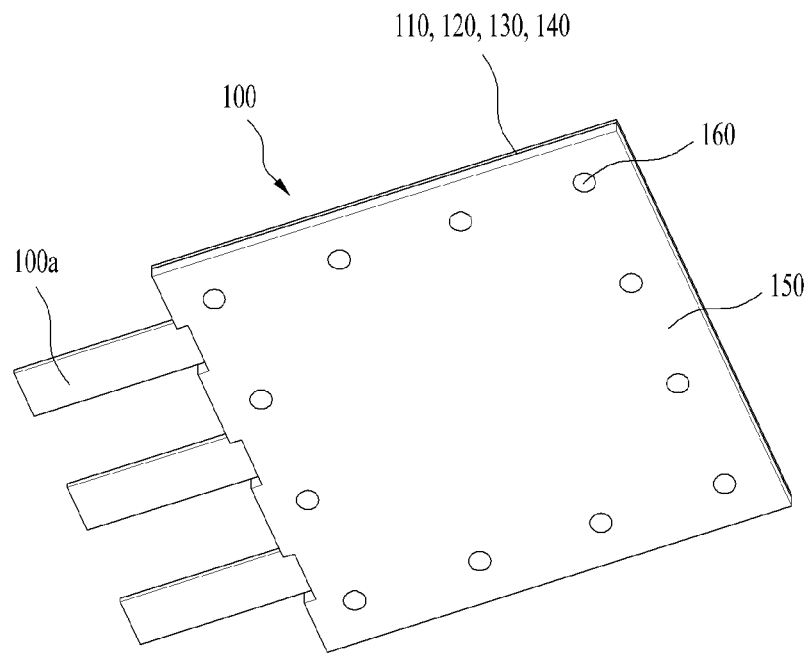
FIG. 10 is a perspective view illustrating a flexible LED film detachably configured in the mounter.
Figure 10:
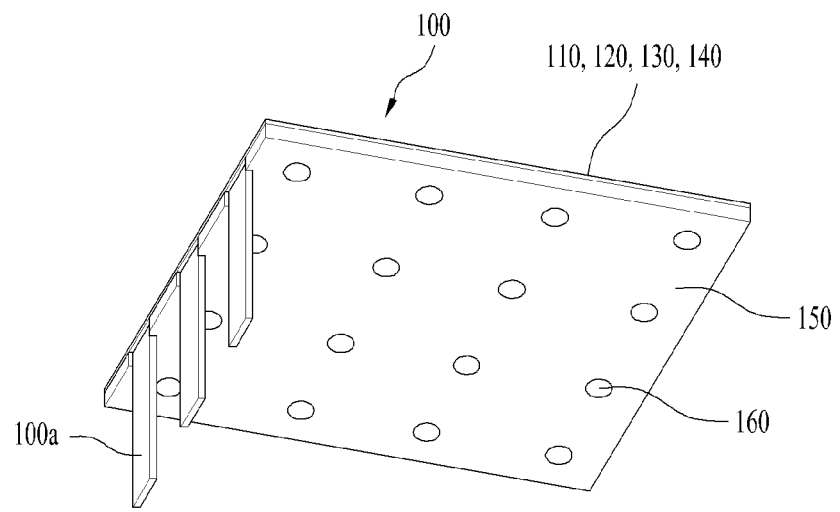

The following description will be given with reference to FIGS. 3 to 7 again and FIG. 10 additionally. FIG. 10 is a perspective view illustrating a flexible LED film detachably configured in the mounter.

For a detachable LED film 100, various configurations or mechanisms may be applied to the LED film module. For example, as shown in FIG. 10, the LED film 100 may further include a heat sink 150 attached to a rear surface, that is, a surface facing the mounter 200. The heat sink 150 may have high thermal conductivity, and at the same time may have magnetism. Since metal materials generally have high thermal conductivity and magnetism, the heat sink 150 may be made of a metal material. Also, as shown in FIG. 3, the supporter 220 (or column 221) of the mounter 200 may include a magnetism 222 attached to a front surface or end surface of the supporter 220, that is, a surface facing the LED film 100. Although FIG. 3 exemplarily illustrates that the magnetism 222 is attached onto any one column 221 of the supporter 220, a plurality of magnetisms 222 may be attached to an entire surface of the supporter 220, that is, front surfaces of all the columns 221. The magnetism 222, that is, a magnet is configured to attract the heat sink 150 having magnetism. Therefore, the LED film 100 may detachably be coupled to the mounter 200 by using the heat sink 150 and the magnetism 222. Also, unlike the aforementioned description, deformation may be performed such that the magnetism 222 is applied to the LED film 100 and the heat sink 150 is applied to the mounter 200.

In another aspect, as shown in FIG. 10, the LED film 100 may further include a protrusion 160 attached to the rear surface of the LED film, that is, a surface facing the mounter 200. The protrusion 160 may be made of a material having magnetism. Since metal materials generally have high thermal conductivity and magnetism, the protrusion 160 may be made of the same material as that of the heat sink 150. That is, the protrusion 160 may additionally be provided on the heat sink 150, and may be formed in a single body with the heat sink 150 or may be attached to the heat sink 150 as a separate member. Also, the protrusion 160 may be made of a material having magnetism different from that of the heat sink 150 and attached to the heat sink 150. Moreover, the protrusion 160 may directly be attached to the rear surface of the LED film 100 without the heat sink 150. Also, as shown in FIGS. 3 to 6, the supporter 220 (or column 221) of the mounter 200 may include a recess 223 formed on the front surface or end surface of the supporter, that is, a surface facing the LED film 100. Also, a magnetic body 223a configured to attract the protrusion 160 having magnetism may be disposed inside the recess 223. In more detail, the magnetic body 223a may be fitted into the recess 223 to form an inner surface of the recess 223. Therefore, when the LED film 100 is combined with the mounter 200, the protrusion 160 may be inserted into the recess 223, whereby the LED film 100 having the protrusion 160 may be disposed at an exact position on the mounter 200, that is, the position of the recess 223. That is, the protrusion 160 and the recess 223 may serve to determine the position of the LED film 100 with respect to the mounter 200. Also, since the protrusion 160 and the magnetic body 223a provide a detachable coupling, the LED film 100 may detachably be coupled to the mounter 200 by using the protrusion 160 and the magnetic body 223a. Also, unlike the aforementioned description, the magnetic body 223a may be applied to the LED film 100 and a member pulled by the magnetic body like the protrusion 160 may be applied to the mounter 200.

Figure 11:
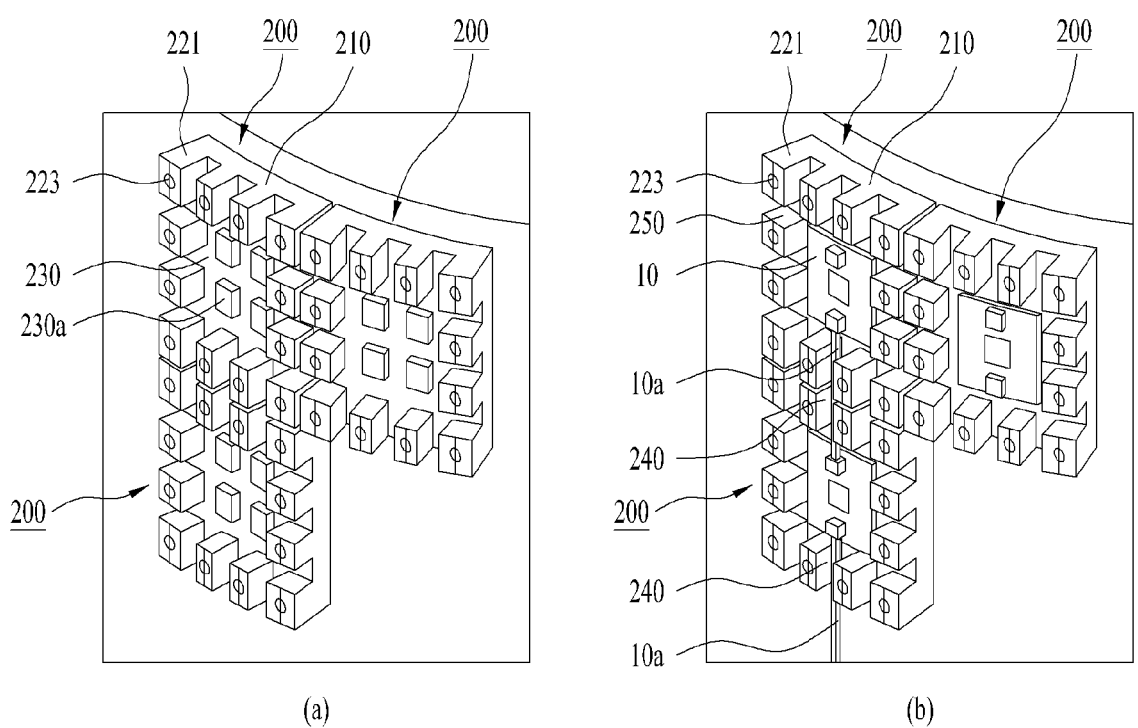
FIG. 11 is a perspective view illustrating mounters and fixed plates, which are combined to form a large scaled screen.
Figure 12:
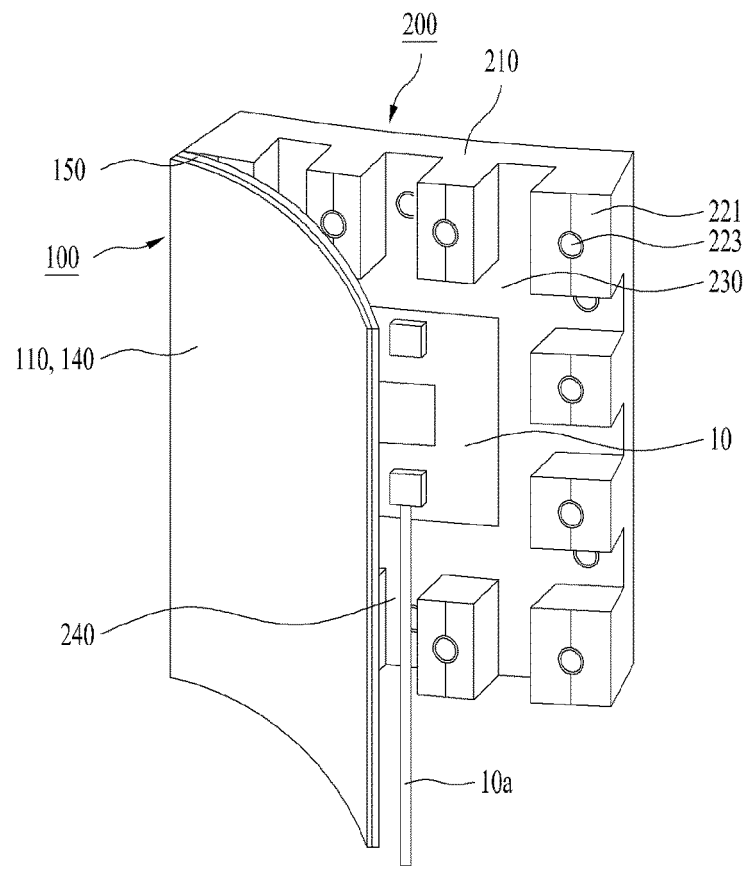
FIG. 12 is a perspective view illustrating flexible LED films attached to mounters combined to form a large scaled screen.
Figure 12:
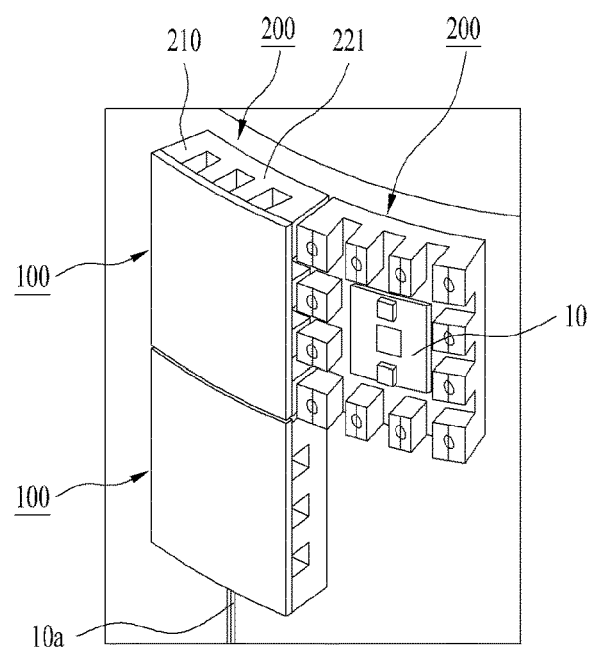
Figure 13:
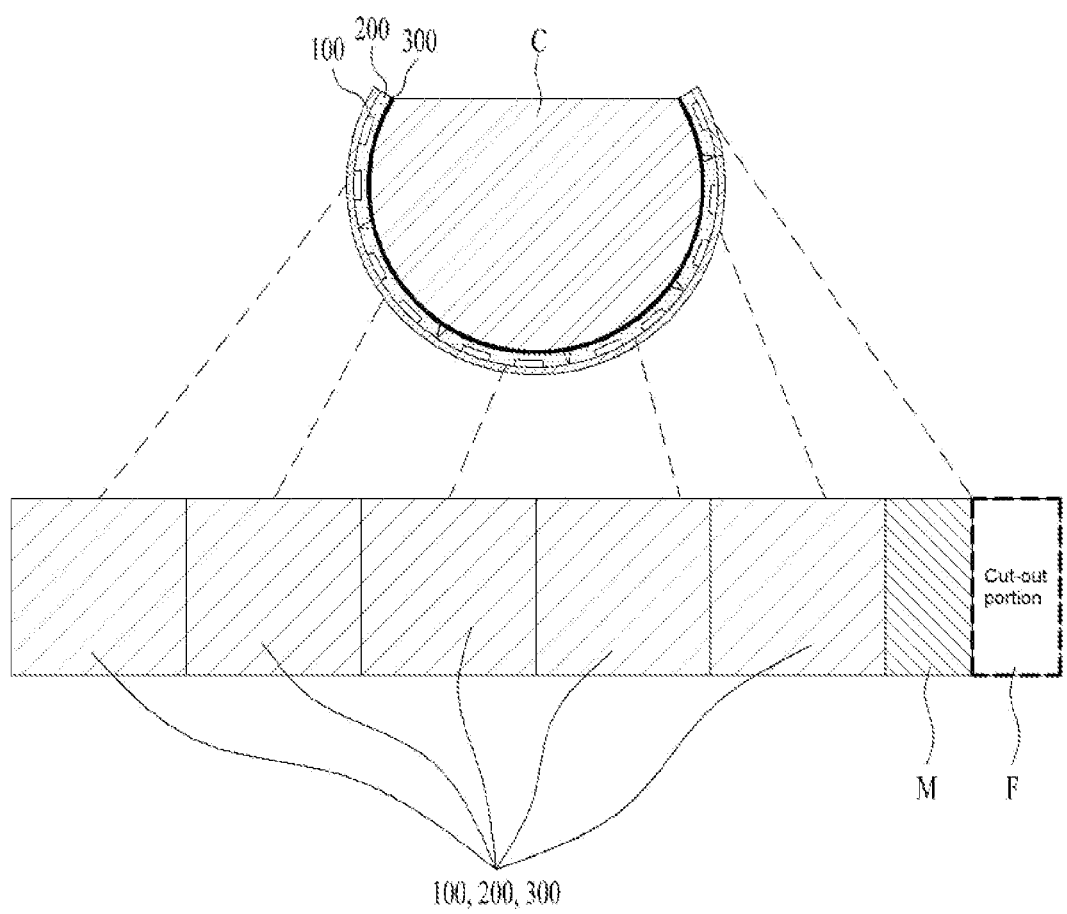
FIG. 13 is a brief view illustrating an example of a flexible LED film module cut to be suitable for a size of a surface on which the flexible LED film module is installed.

Based on the aforementioned features, a procedure of substantially installing the LED film module on the installation surface having a shape change will be described below. The following procedure will be described regarding the plurality of film modules installed on the installation surface made of a curved surface having a predetermined curvature, for example. This installation procedure will basically be described with reference to FIGS. 1 to 10 and additionally described with reference to FIGS. 11 to 13. FIG. 11 is a perspective view illustrating mounters and fixed plates, which are combined to form a large scaled screen, and FIG. 12 is a perspective view illustrating flexible LED films attached to mounters combined to form a large scaled screen. Also, FIG. 13 is a brief view illustrating an example of a flexible LED film module cut to be suitable for a size of a surface on which the flexible LED film module is installed.

First of all, referring to FIG. 11(*a*), a plurality of mounters 200 may be disposed on the installation surface to install a plurality of LED film modules. The mounters 200 may be disposed to adjoin one another such that the LED films 100 which will be installed on the mounters form one continuous large scaled screen, and more exactly may be disposed to abut one another. At the same time, the mounters 200 may be deformed to be suitable for the shape of the installation surface. As described with reference to FIGS. 3 and 4, the mounters 200 may directly be coupled to fixed onto the installation surface by using the fastening hole 210a and the fastening member. In another aspect, as described with reference to FIGS. 5 to 7, the mounters 200 may be coupled onto the fixed plate 300 coupled to the installation surface. In this case, the mounters 200 may move relatively to the fixed plate 300 by using moving structures 211 to 213 as shown in FIG. 8, whereby an interval between the mounters 200 may additionally be controlled to be suitable for formation of one continuous large scaled screen.

Afterwards, as shown in FIG. 11(*b*), the control component 10 may be installed in the recess 230 of each mounter 200. As shown in FIGS. 3 and 4 as well as FIG. 11(*b*), the control component 10 may be installed in the recess 230 by using the first coupling mechanism 230a. In another aspect, the second coupling mechanism 230b shown in FIGS. 5 to 7 may be applied to the recess 230 to avoid deformation and dislocation of the control component 10, and the control component 10 may be installed in the recess 230 by using the second coupling mechanism 230b. Therefore, the control component 10 may be embedded in the mounter 200, and may easily be connected with the LED film 100 coupled to the mounter 200. Meanwhile, the control component 10 needs to be connected with an external network or another external device to receive a signal or information for driving the LED film 100. Also, the control component 10 needs to be connected with an external power to supply a power to the LED film 100. However, as shown, if the plurality of LED film modules are disposed without interval, it is difficult for a cable for connecting an external device and power to reach the LED film modules disposed at the center, that is, the control component 10 of the modules surrounded by the other LED film modules. For this reason, as shown in FIG. 11(*b*), the control components 10 adjacent to each other are connected with each other by a cable 10a, and the control component 10 disposed at the outmost may be connected to the external device and power. Therefore, the information/signal and power supplied from the external device and power may be relayed by the cable 10a from the outmost control component 10 and the control components 10 connected with each other and then provided to the all the control components 10. As described above, since the control components 10 are disposed in the recess 230 inside the supporter 220, the cable 10a should pass through the supporter 220 to allow the control components 10 to be connected with each other. Therefore, the mounter 200 may include a first channel 240 formed in the supporter 220 and configured to pass through the cable 10a. Also, the control component 10, especially the outmost control component 10 may be connected with the external device and power by using the cable 10a extended through the first channel 240. If the supporter 220 is comprised of a continuous member, the first channel 240 may be comprised of an opening or recess formed in the supporter 220. In another aspect, if the supporter 220 is comprised of the columns 221 detached from each other, the first channel 240 may be comprised of a clearance between the columns 221 as shown in FIG. 11(b).

If the control component 10 is installed in the mounter 20, as shown in FIG. 12(a), the LED film 100 may be coupled to the supporter 220 of each mounter 200. For coupling of the LED film 100, the LED film 100 may first be connected with the control component 10 such that the LED film 100 may be supplied with a signal and power. Since the control component 10 is disposed in the recess 230 below the LED film 100, as shown in FIG. 10(b), the terminal 100a of the LED film 100 may be folded downwardly. In order that the folded terminal 100a is connected with the control component 10 disposed in the recess 230 inside the supporter 220, the terminal 100a should pass through the supporter 220. Therefore, as well shown in FIG. 11(b), the mounter 200 may include a second channel 250 formed in the supporter 220 and configured to pass through the terminal 100a. If the supporter 220 is comprised of a continuous member, the second channel 250 may be comprised of an opening or recess formed in such a supporter 220. In another aspect, if the supporter 220 is comprised of columns 221 detached from each other, the second channel 250, as shown in FIG. 11(b), may be comprised of a clearance between the columns 221. Also, the LED film 100 may detachably be coupled to the supporter 220 by using various elements 150, 160, 222, 223 and 223a described with reference to FIGS. 3, 4 and 9. Particularly, if the recess 223 and the protrusion 160 inserted into the recess 223 are used, the LED film 100 may detachably be coupled to the supporter 220 and at the same time may be disposed at the exact position of the supporter 220 by a positioning function of these members 160 and 223.

Afterwards, as shown in FIG. 12(b), the plurality of films 100 may be coupled to the corresponding mounters 200 through the aforementioned procedure. The coupled LED films 100 may be connected with each other to form one continuous large scaled screen, and may provide a user with desired image information. Also, if the LED film 100 is damaged or disordered during operation, the detachable LED film 100 may easily be detached to be exchanged with another film 100 or repaired. Moreover, even in the case that the control component 10 and the cable 10a are damaged or disordered, if the LED film 100 is easily detached, the control component 10 and the cable 10a may easily be accessible. Therefore, the corresponding control component 10 and cable 10a may conveniently be exchanged and repaired.

Meanwhile, the LED film module may be manufactured to have a standardized size for efficient production and sale. Therefore, the intended installation surface may not be matched with the standardized size. For example, as shown in FIG. 13, if the plurality of LED film modules are installed on a surface of a column C, the surface of the column C may not be matched with a total size (that is, width and/or length) of the plurality of LED film modules which are standardized. In this case, since the elements 100 to 300 of the LED film module are able to be easily cut, an unnecessary portion F may be removed and the other portion M may be cut to be suitable for the installation surface which is required. Therefore, each of the LED film modules may have a size matched with the installation surface which is required, whereby productivity and functionality may be improved.

Considering the aforementioned features described in detail, each of the LED film modules 100 to 300 may stably and easily be installed on various installation surfaces having a shape change. Also, for the same reason, the plurality of LED film modules may properly be combined on the installation surface, and a single large scaled screen which is intended may effectively be implemented. Moreover, the installed LED film module may easily and conveniently be maintained and repaired.

The above detailed description is to be considered in all respects as illustrative and not restrictive. The scope of the specification should be determined by reasonable interpretation of the appended claims and all change which comes within the equivalent scope of the present application are included in the scope of the present application.

The invention claimed is:

1. A flexible light emitting diode (LED) film module comprising:
    a flexible LED film; and
    a mounter provided on the flexible LED film so as to install the flexible LED film on a predetermined surface, and configured to be deformable in accordance with a shape of the predetermined surface,
    wherein the mounter comprises:
    a base configured to be coupled to the predetermined surface; and
    a supporter disposed along an edge of a plate and extended from the base at a predetermined height to support the flexible LED film to be spaced apart from the base; wherein the supporter comprises a recess disposed inside the supporter, wherein the recess is configured to accommodate a control component of the flexible LED film.

2. The flexible LED film module of claim 1, wherein the supporter is comprised of a plurality of columns extended from the base at a predetermined height and spaced apart from each other at a predetermined interval.

3. The flexible LED film module of claim 1, wherein the mounter further comprises a coupling mechanism disposed inside the recess and configured to couple the control component to the mounter.

4. The flexible LED film module of claim 3, wherein the coupling mechanism is disposed on a center line of the mounter to allow the control component not to be deformed together with the mounter which is deformed.

5. The flexible LED film module of claim 3, wherein the coupling mechanism further comprises:
    a fixed rod protruded from the base of the mounter at a predetermined height; and
    a holder coupled to the fixed rod and configured to hold the control component to be spaced apart from the base.

6. The flexible LED film module of claim 5, wherein the coupling mechanism further comprises a boss extended from the base at a predetermined height to surround the fixed rod and configured to support the control component.

7. The flexible LED film module of claim 1, further comprising a fixed plate interposed between the base and the predetermined surface and configured to couple the base to the predetermined surface.

8. The flexible LED film module of claim 7, wherein the fixed plate is fixed to the predetermined surface so as not to move, and the base is movably coupled to the fixed plate.

9. The flexible LED film module of claim 7, wherein the supporter comprises an outer side inclined toward an outside of the supporter.

10. The flexible LED film module of claim 1, wherein the supporter comprises an outer side inclined toward an outside of the supporter.

11. The flexible LED film module of claim 1, wherein the flexible LED film is configured to be detachably coupled to the mounter.

12. The flexible LED film module of claim 1, wherein the flexible LED film further comprises a heat sink provided on a rear surface of the flexible LED film, having high thermal conductivity and magnetism, and the supporter further comprises a magnetic body provided on a front surface of the supporter and configured to attract the heat sink.

13. The flexible LED film module of claim 1, wherein the flexible LED film further comprises a protrusion provided on a rear surface of the flexible LED film, having magnetism, and the supporter further comprises a recess provided on a front surface of the supporter, including a magnetic body attracting the protrusion.

14. The flexible LED film module of claim 1, wherein the mounter comprises a first channel formed in the supporter and configured to allow a cable connecting the control component with another external control component to pass therethrough.

15. The flexible LED film module of claim 1, wherein the mounter comprises a second channel formed in the supporter and configured to allow a terminal connecting the flexible LED film with the control component to pass therethrough.

* * * * *